United States Patent
Kim

(10) Patent No.: US 9,383,647 B2
(45) Date of Patent: Jul. 5, 2016

(54) RESIST FILM AND METHOD OF FORMING PATTERN

(71) Applicant: SAMSUNG ELECTRO-MECHANICS CO., LTD., Suwon-Si, Gyeonggi-Do (KR)

(72) Inventor: Su Il Kim, Chungcheongnam-do (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 14/563,893

(22) Filed: Dec. 8, 2014

(65) Prior Publication Data
US 2015/0168839 A1 Jun. 18, 2015

(30) Foreign Application Priority Data
Dec. 13, 2013 (KR) .................. 10-2013-0155692

(51) Int. Cl.
G03F 7/11 (2006.01)
G03F 7/16 (2006.01)
G03F 7/30 (2006.01)

(52) U.S. Cl.
CPC .. *G03F 7/11* (2013.01); *G03F 7/16* (2013.01); *G03F 7/30* (2013.01)

(58) Field of Classification Search
CPC .............. G03F 7/11; G03F 7/16; G03F 7/30
USPC ................ 430/271.1, 273.1, 322, 325, 329
See application file for complete search history.

(56) References Cited

U.S. PATENT DOCUMENTS

| | | | | |
|---|---|---|---|---|
| 7,432,191 B1* | 10/2008 | Stamper | ............ | H01L 21/0276 257/E21.579 |
| 7,662,540 B2* | 2/2010 | Takashima | ............ | G03F 7/0007 430/270.1 |
| 7,687,224 B2* | 3/2010 | Kimura | ............ | G03F 7/092 430/270.1 |
| 7,736,834 B2* | 6/2010 | Miyasaka | ............ | G03F 7/42 430/270.1 |
| 8,258,511 B2* | 9/2012 | Ye | ............ | H01L 21/02521 257/103 |
| 8,349,549 B2* | 1/2013 | Maemori | ............ | G03F 7/38 430/270.1 |
| 8,895,226 B2* | 11/2014 | Kim | ............ | G03F 7/095 430/270.1 |
| 8,906,597 B2* | 12/2014 | Rock | ............ | G03F 7/095 430/322 |
| 9,029,070 B2* | 5/2015 | Shimizu | ............ | C08F 220/18 430/311 |
| 9,075,310 B2* | 7/2015 | Shirakawa | ............ | G03F 7/11 |
| 9,086,633 B2* | 7/2015 | Flagello | ............ | G03F 7/095 |
| 9,091,921 B2* | 7/2015 | Yoshida | ............ | G03F 7/0047 |

FOREIGN PATENT DOCUMENTS

KR 10-2006-0042015 A 5/2006

* cited by examiner

*Primary Examiner* — Amanda C Walke
(74) *Attorney, Agent, or Firm* — NSIP Law

(57) ABSTRACT

Disclosed herein is a resist film including: a pattern forming resist layer; and a liquid contact preventing resist layer adhered to any one surface of upper and lower surfaces of the pattern forming resist layer, in order to prevent a physical and chemical change of a resist due to a spray pressure applied when a developing solution is sprayed in a development process.

12 Claims, 3 Drawing Sheets

RESIST FILM AND METHOD OF FORMING PATTERN

CROSS REFERENCE(S) TO RELATED APPLICATIONS

This application claims the foreign priority benefit under 35 U.S.C. Section 119 of Korean Patent Application Serial No. 10-2013-0155692, entitled "Resist Film and Method of Forming Pattern" filed on Dec. 13, 2013, which is hereby incorporated by reference in its entirety into this application.

BACKGROUND OF THE INVENTION

1. Technical Field

The present invention relates to a resist film, and more particularly, to a resist film used for forming a circuit wiring of a printed circuit board.

2. Description of the Related Art

A resist is generally used for forming a circuit wiring in a printed circuit board. For example, describing a MSAP method which is one of methods of forming a circuit, a seed layer is deposited on one surface of a substrate and a resist is then attached thereto, which in turn is subjected to exposure and development processes to thereby form a resist pattern. Next, the seed layer is electroplated by a lead wire to thereby deposit a metal between the resist patterns, and the seed layer exposed to the outside after removing the resist is etched to thereby form the circuit wiring (see Korean Patent Laid-Open Publication No. 10-2006-0042015).

Meanwhile, the resist may be included in the outermost layer of the substrate to thereby serve to protect the substrate in addition to forming the circuit. In this case, in order to connect between elements such as a pad, a semiconductor chip, and the like formed on the outermost layer of the substrate, an opening part exposing the pad of the substrate needs to be formed in the resist, which is also performed by the exposure and development processes.

As such, the pattern or the opening part is formed by performing the exposure and development processes on the resist. In this case, at the time of the development process, a developing solution is directly sprayed to the resist. In this case, the developing solution physically hits a surface of the resist with a spray pressure. As a result, an undercut phenomenon in which a lower portion of the pattern which is insufficiently cured is separated may occur. This may cause a pattern lifting problem.

In addition, an abrasion such as a scratch, a tear, or the like may be formed on a pattern surface due to the cutting phenomenon of the surface of the pattern and an appearance defect in which a variety of filler contained in the resist is protruded to the outside may occur. Even if the scratch is small, in the case in which high pressure is applied to the substrate when an element is mounted on the substrate, a size of the scratch is gradually increased, thereby causing damage to the whole resist.

Meanwhile, the resist is generally composed using a polymer having a carboxyl group (—COOH) as a functional group in order to improve hydrophilic property. However, in the case in which carboxyl group (—COOH) molecules on the resist surface are separated due to the physical hit by the spray pressure, the resist surface is changed to be hydrophobic. As a result, surface energy of the resist may be decreased, thereby deteriorating flowability of a resin in an underfill process when the element is mounted on the substrate.

RELATED ART DOCUMENT

Patent Document (Patent Document 1) Korean Patent Laid-Open Publication No. 10-2006-0042015.

SUMMARY OF THE INVENTION

An object of the present invention is to prevent a resist from being physically and chemically changed by preventing a developing solution from being directly sprayed onto a resist layer on which a pattern is formed and to solve the problem as described above.

According to an exemplary embodiment of the present invention, there is provided a resist film including: a pattern forming resist layer; and a liquid contact preventing resist layer adhered to any one surface of upper and lower surfaces of the pattern forming resist layer.

The liquid contact preventing resist layer may be made of a material which is exposable and developable.

The liquid contact preventing resist layer may be developable by the same developing solution as a developing solution used for developing the pattern forming resist layer.

The pattern forming resist layer may have a dry or liquid form.

A protective film may be attached onto any one surface of an outer exposed surface of the liquid contact preventing resist layer and an outer exposed surface of the pattern forming resist layer.

The pattern forming resist may include a cured portion and an uncured portion.

According to another exemplary embodiment of the present invention, there is provided a method of forming a pattern, the method including: attaching a pattern forming resist layer onto one surface of the substrate; selectively exposing the pattern forming resist layer; laminating a liquid contact preventing resist layer on the pattern forming resist layer; and spraying a developing solution on a surface of the liquid contact preventing resist layer.

In the spraying of the developing solution, the liquid contact preventing resist layer and an uncured portion of the pattern forming resist layer may be developed together.

The attaching of the pattern forming resist layer may be performed by applying liquid resist ink.

According to another exemplary embodiment of the present invention, there is provided a method of forming a pattern, the method including: preparing a resist film having a pattern forming resist layer and a liquid contact preventing resist layer adhered to each other; attaching the resist film onto one surface of a substrate using the pattern forming resist layer as an adhering surface; selectively exposing and developing the resist film; and removing the liquid contact preventing resist layer.

In the exposing of the resist film, light may be irradiated so as to expose up to the pattern forming resist layer.

In the developing of the resist film, an uncured portion of the liquid contact preventing resist layer and an uncured portion of the pattern forming resist layer may be developed together.

DESCRIPTION OF THE PREFERRED EMBODIMENTS

Various advantages and features of the present invention and technologies accomplishing thereof will become apparent from the following description of exemplary embodiments with reference to the accompanying drawings. However, the present invention may be modified in many different forms and it should not be limited to exemplary embodiments set forth herein. These exemplary embodiments may be provided so that this disclosure will be thorough and complete, and will fully convey the scope of the invention to those skilled in the art.

Meanwhile, terms used in the present specification are for explaining the embodiments rather than limiting the present invention. Unless specifically mentioned otherwise, a singular form includes a plural form in the present specification. The word "comprise" and variations such as "comprises" or "comprising," will be understood to imply the inclusion of stated constituents, steps, operations and/or elements but not the exclusion of any other constituents, steps, operations and/or elements.

Hereinafter, a configuration and an acting effect of exemplary embodiments of the present invention will be described in more detail with reference to the accompanying drawings.

Figure 1:
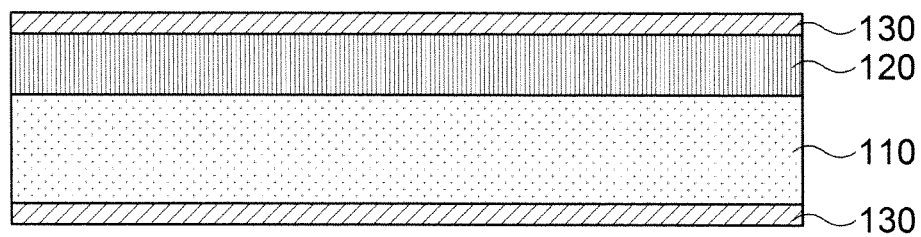
FIG. 1 is a cross-sectional view of a resist film according to an exemplary embodiment of the present invention.

FIG. 1 is a cross-sectional view of a resist film according to an exemplary embodiment of the present invention. Additionally, components shown in the accompanying drawings are not necessarily shown to scale. For example, sizes of some components shown in the accompanying drawings may be exaggerated as compared with other components in order to assist in the understanding of the exemplary embodiments of the present invention. Meanwhile, throughout the accompanying drawings, the same reference numerals will be used to describe the same components. For simplification and clarity of illustration, a general configuration scheme will be shown in the accompanying drawings, and a detailed description of the feature and the technology well known in the art will be omitted in order to prevent a discussion of the exemplary embodiments of the present invention from being unnecessarily obscure.

Referring to FIG. 1, a dry film resist 100 according to an exemplary embodiment of the present invention may have a structure in which a pattern forming resist layer 110 and a liquid contact preventing resist layer 120 are laminated in a thickness direction while facing each other.

The pattern forming resist layer 110, which is a layer directly contacting a substrate, may have a predetermined pattern formed through exposure and development processes. Here, in the case in which the dry film resist 100 according to an exemplary embodiment of the present invention is used for forming a circuit wiring of the substrate, a pattern may be formed in a form corresponding to the circuit wiring of the substrate. Alternatively, in the case in which the dry film resist 100 is laminated on the outermost layer of the substrate to protect the outermost layer of the substrate, the pattern may be formed in an opening part form exposing a pad of the substrate.

Therefore, the pattern forming resist layer 110 may be composed of a photo-curable polymer resin having excellent adhesion and resolution properties for a base substrate and capable of being cured by an exposure process, as a main component. For example, as a main resin composition configuring the pattern forming resist layer 110, one kind of an acrylic based polymer, a styrene based polymer, an epoxy based polymer, an amide based polymer, an amide epoxy based polymer, an alkyd based polymer, and a phenol based polymer improving a mechanical strength of a photopolymer composition and having excellent chemical adhesive property to a metal material (e.g., Cu) for the circuit wiring of the substrate may be solely used, or two or more kinds thereof may be combined. Particularly, among the above-mentioned polymers, the polymer containing a carboxyl group (—COOH) is desirable.

Since the pattern forming resist layer 110 composed of the above-mentioned polymers has property in which development and delamination occur in an alkalescent aqueous solution (for example, $Na_2CO_3$) and the polymer having the carboxyl group (—COOH) as a functional group has high hydrophile property, surface energy may be significantly increased. This may improve flowability of the resin in an underfill process when an element is mounted.

The pattern forming resist layer 110 may further include a monofunctional monomer or a multifunctional monomer of two or more functional monomer, a photoinitiator deriving radical by light so that photopolymerization occurs, and additives such as a stabilizer, an adhesion promoter, a thermal polymerization inhibitor, and the like, in addition to the polymers as mentioned above.

Meanwhile, in the case in which the pattern forming resist layer 110 is laminated on the outermost layer of the substrate to protect the outermost layer of the substrate, in order to increase heat resisting stability, dimensional stability by heat, resin adhesion, and the like, known fillers, for example, barium sulfate, fine power silicon carbide, amorphous silica, talc, mica, and the like may be contained in the polymer resins as described above.

The pattern forming resist layer 110 may be present in a dry or liquid form. In the case in which the pattern forming resist layer 110 has the dry form, the pattern forming resist layer 110 is handled as a state in which it is adhered to the liquid contact preventing resist layer 120 before being attached to the substrate. On the other hand, in the case in which the pattern forming resist layer 110 has the liquid form, resist ink is applied on the substrate and is then dried, such that the pattern forming resist layer 110 is manufactured and the liquid contact preventing resist layer 120 is adhered on the pattern forming resist layer 110.

The liquid contact preventing resist layer 120 is a layer adhering to any one surface of upper and lower surfaces of the pattern forming resist layer 110. If the pattern forming resist layer 110 is directly adhered to the substrate, the liquid contact preventing resist layer 120 is laminated on the pattern forming resist layer 110.

By the structure as described above, at the time of the development process, a developing solution is directly sprayed to the liquid contact preventing resist layer 120. Therefore, a direct contact between the pattern forming resist layer 110 and the developing solution may be blocked by the liquid contact preventing resist layer 120. As a result, a physical and chemical change of the pattern forming resist layer 110 caused by a spray pressure may be prevented.

If the developing solution is directly sprayed to the pattern forming resist layer 110 because the liquid contact preventing resist layer 120 is not present, an undercut phenomenon in which a lower portion of the pattern which is insufficiently cured is separated by physical hit of the spray pressure may occur.

In addition, an abrasion such as a scratch, a tear, or the like may be formed on a surface due to the cutting phenomenon of the surface and an appearance defect in which a variety of filler contained in the pattern forming resist layer 110 is protruded to the outside may occur.

In addition, the carboxyl group (—COOH) molecules on the surface of the pattern forming resist layer 110 are separated, such that the surface of the pattern forming resist layer 110 is changed to be hydrophobic. As a result, surface energy of the resist layer 110 may be decreased, thereby significantly deteriorating flowability of the resin in an underfill process when the element is mounted.

Therefore, as in the present invention, when the direct contact between the developing solution and the pattern forming resist layer 110 is blocked by the liquid contact preventing resist layer 120, the problems due to the physical and chemical change occurring from the structure according to the related art may be solved.

Meanwhile, although it will be described below, the development process is performed in a state in which the liquid contact preventing resist layer 120 is laminated during the formation of the pattern. Therefore, the liquid contact preventing resist layer 120 may be made of a material which may be developed so that the pattern forming resist layer 110 of the lower portion may be developed. More preferably, it is preferable to use a material which may be developed by the same developing solution as the developing solution (e.g., $Na_2CO_3$) used for developing the pattern forming resist layer 110. This is to simultaneously develop the pattern forming resist layer 110 and the liquid contact preventing resist layer 120 by a single development process.

In addition, the pattern forming resist layer 110 may be composed of a photo-curable resin which may be cured by the exposure process and the exposure process, as a main component. A method of forming a pattern using those described above will be described below in detail.

In the case in which the resist film 100 according to an exemplary embodiment of the present invention has the dry form, the resist film 100 is typically handled in a state in which it is wound around a roll. Therefore, the resist film 100 according to an exemplary embodiment of the present invention may further include a protective film 130 attached onto any one surface (preferably, both surfaces) of an outer exposed surface of the liquid contact preventing resist layer 120 and an outer exposed surface of the pattern forming resist layer 110.

The protective film 130 protects the pattern forming resist layer 110 and the liquid contact preventing resist layer 120 from physical impact and foreign materials such as dust generated during which the protective film 130 is handled, and is removed at the time of the attachment to the substrate to thereby be used. The protective film 130 may be typically made of a polyethylene material, or the like, and may have a thickness of a range of 10 to 50 μm.

Figure 2:
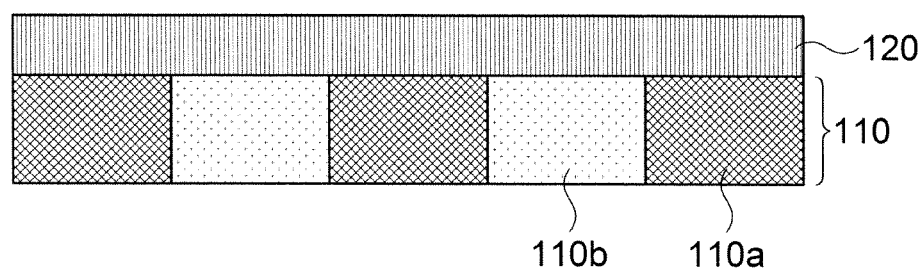
FIG. 2 is a cross-sectional view of a resist film according to another exemplary embodiment of the present invention.

Meanwhile, FIG. 2 is a cross-sectional view of a resist film according to another exemplary embodiment of the present invention. A resist film 100 having a structure shown in FIG. 2 may have a pattern forming resist layer 110 classified into a cured portion 110a and an uncured portion 110b according to a laminated order of the liquid contact preventing resist layer 120. The classification of the cured portion 110a and the uncured portion 110b is determined by selectively performing an exposure process depending on a pattern of a circuit wiring.

That is, the resist film 100 having the structure shown in FIG. 2 may be completed by first performing the exposure process for the pattern forming resist layer 110 when the pattern forming resist layer 110 is attached to the substrate and laminating the liquid contact preventing resist layer 120 thereon. A method of forming a pattern using those described above will be described below in detail.

Figure 3:
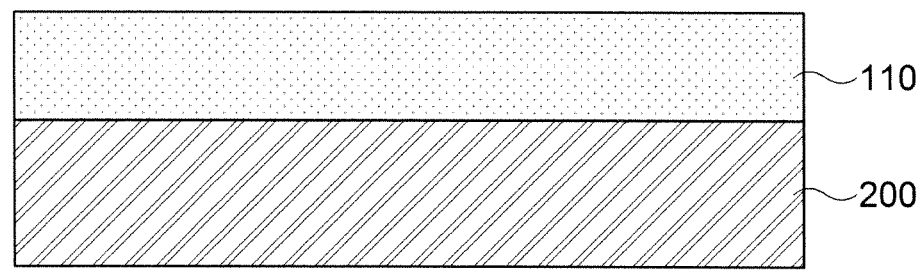
FIGS. 3 to 6 are process diagrams sequentially showing a method of forming a pattern according to a first exemplary embodiment of the present invention.

FIGS. 3 to 6 are process diagrams sequentially showing a method of forming a pattern according to a first exemplary embodiment of the present invention. First, as shown in FIG. 3, the pattern forming resist layer 110 is attached onto one surface of a substrate 200. This may be performed by coating resist ink with a curtain coating method, a spray coating method, a roll coating method, or the like at a predetermined thickness and then drying the coated resist ink. Of course, this may also be performed by attaching the pattern forming resist layer 110 having the dry form to the substrate using a lamination facility. However, as described above, in the case in which the pattern forming resist layer 110 has the dry form, since the pattern forming resist layer 110 and the liquid contact preventing resist layer 120 are handled in a state in which they are adhered to each other, it is more preferable to form the pattern by applying a liquid resist ink.

Here, the substrate 200 may be several types of substrates such as a single sided substrate, a double sided substrate, or a multilayer substrate, and the pattern forming resist layer 110 attached to the substrate 200 may be used for forming the circuit wiring of the substrate or protecting the outermost layer of the substrate.

Figure 4:
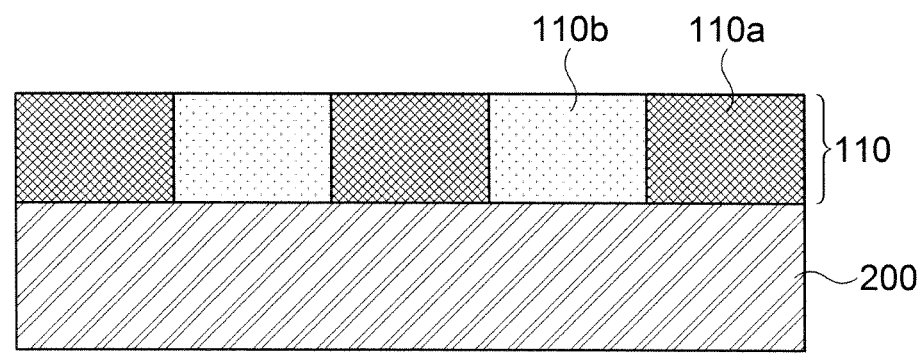

As such, when the pattern forming resist layer 110 is attached onto the substrate 200, an operation of selectively exposing the pattern forming resist layer 110 is performed, as shown in FIG. 4. The exposure process is performed by a typical exposure method known in the art such as a contact exposure method using an art work (photo mask), a laser direct image (LDI) exposure method without using the photo mask, or the like, and is not limited to any specific exposure method.

When light is selectively irradiated according to a desired pattern, a portion to which light is irradiated is subject to a photopolymerization reaction to be cured, thereby forming the cured portion 110a, and a portion to which light is not irradiated forms the uncured portion 110b. Of course, unlike the negative method as described above, a positive method in which the portion to which light is irradiated is removed in the subsequent development process may be used.

Figure 5:
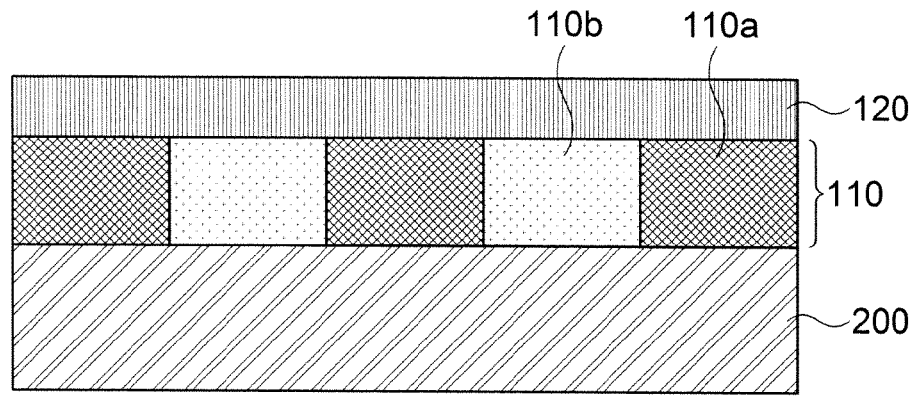

When the exposure process is completed, an operation of laminating the liquid contact preventing resist layer 120 on the pattern forming resist layer 110 is performed, as shown in FIG. 5.

The liquid contact preventing resist layer 120 is made of a material which is developed together with the uncured portion 110b of the pattern forming resist layer 110 in the subsequent development process and has the same area as the pattern forming resist layer 110, such that the entire surface of the pattern forming resist layer 110 of the lower portion may be covered.

Here, the liquid contact preventing resist layer 120 may be handled in the dry form in which a protective film is attached onto both surfaces thereof. Therefore, when the liquid contact preventing resist layer 120 is laminated, the protective film on any one surface of the liquid contact preventing resist layer 120 is removed, the liquid contact preventing resist layer 120 is laminated by using the surface from which the protective film is removed as an adhering surface, and the protective film on the other surface is then removed.

Figure 6:
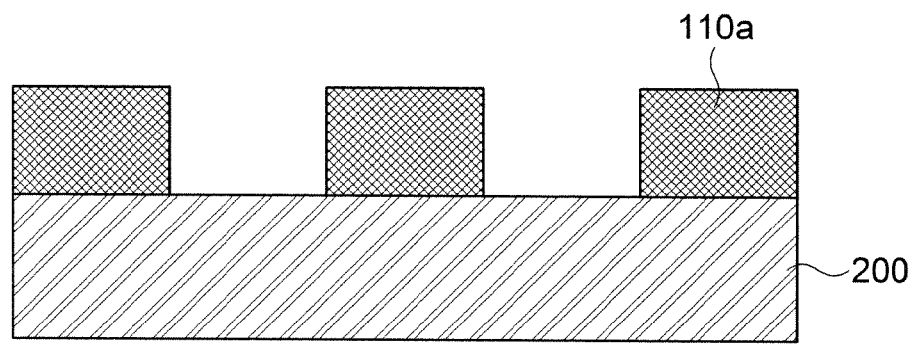

As such, when the liquid contact preventing resist layer 120 is laminated, the pattern is finally completed by spraying the developing solution onto the liquid contact preventing resist layer 120 (FIG. 6).

Since the liquid contact preventing resist layer 120 is made of the material which may be developed, it may be moved together with the uncured portion 110b of the pattern forming resist layer 110 by the development process. In this case, the pattern forming resist layer 110 does not directly contact the developing solution by the liquid contact preventing resist layer 120. Therefore, the physical hit due to the spray pressure may be minimized, thereby making it possible to prevent the undercut phenomenon as in the related art.

In addition, since the cured portion 110a of the pattern forming resist layer 110, that is, the surface of the pattern is protected, abrasion due to the cutting phenomenon of the surface and appearance defect such as filler protrusion, or the like may be prevented.

In addition, the decrease in the carboxyl group (—COOH) molecules on the surface of the pattern is minimized, such that higher hydrophile property may be maintained. As a result, flowability of the resin in the underfill process when the element is mounted may be improved.

Hereinafter, a method of forming a pattern according to a second exemplary embodiment of the present invention will be described.

Figure 7:
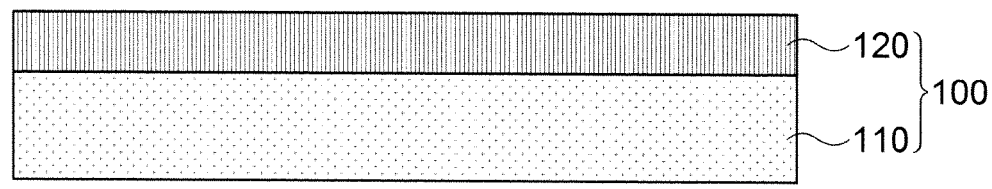
FIGS. 7 to 11 are process diagrams sequentially showing a method of forming a pattern according to a second exemplary embodiment of the present invention.

FIGS. 7 to 11 are process diagrams sequentially showing a method of forming a pattern according to a second exemplary embodiment of the present invention. First, as shown in FIG. 7, a resist film in which a pattern forming resist layer 110 and a liquid contact preventing resist layer 120 are adhered to each other is prepared.

Figure 8:
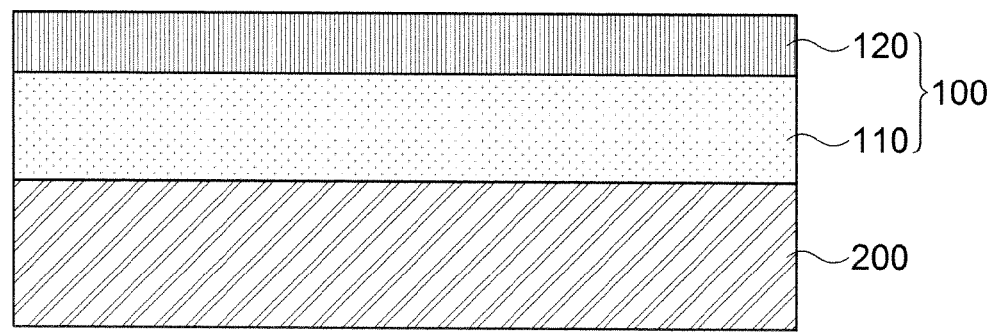

Next, as shown in FIG. 8, the resist film 100 is attached onto one surface of a surface using the pattern forming resist layer 110 as an adhering surface.

Here, the resist film 100 may be prepared in a dry form in which a protective film is attached onto an outer exposed surface of the liquid contact preventing resist layer 120 and an outer exposed surface of the pattern forming resist layer 110, respectively. In this case, the protective film attached onto the outer exposed surface of the pattern forming resist layer 110 is removed, the resist film 100 is attached, and the protective film attached onto the outer exposed surface of the liquid contact preventing resist layer 120 is then removed.

As such, when the resist film 100 is attached onto the substrate, an operation of selectively exposing and developing the resist film 100 is performed.

Figure 9:
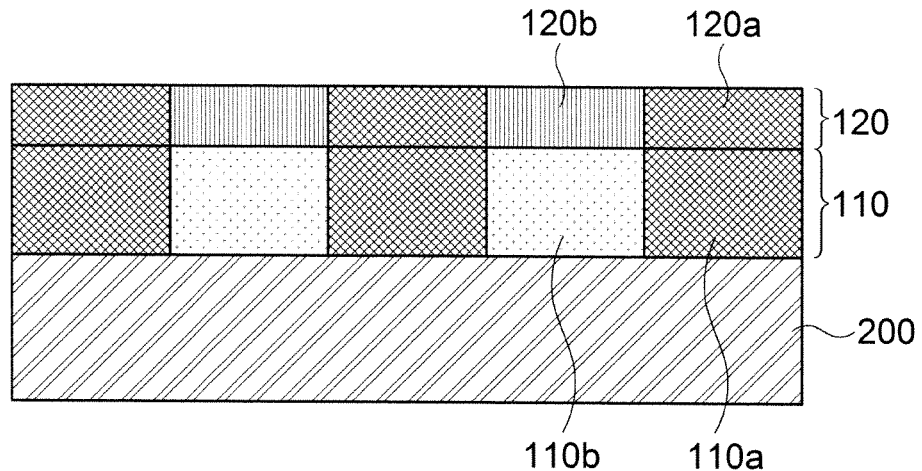

At the time of the exposure process, light is irradiated by adjusting an exposure amount so as to be exposed up to the pattern forming resist layer 110 of the lower portion. Unlike the first exemplary embodiment of the present invention as described above, according to the second exemplary embodiment of the present invention, since the exposure process is performed in a state in which the liquid contact preventing resist layer 120 is laminated, the liquid contact preventing resist layer 120 may also be exposed. Therefore, the liquid contact preventing resist layer 120 may be classified into a cured portion 120a and an uncured portion 12b as shown in FIG. 9.

Figure 10:
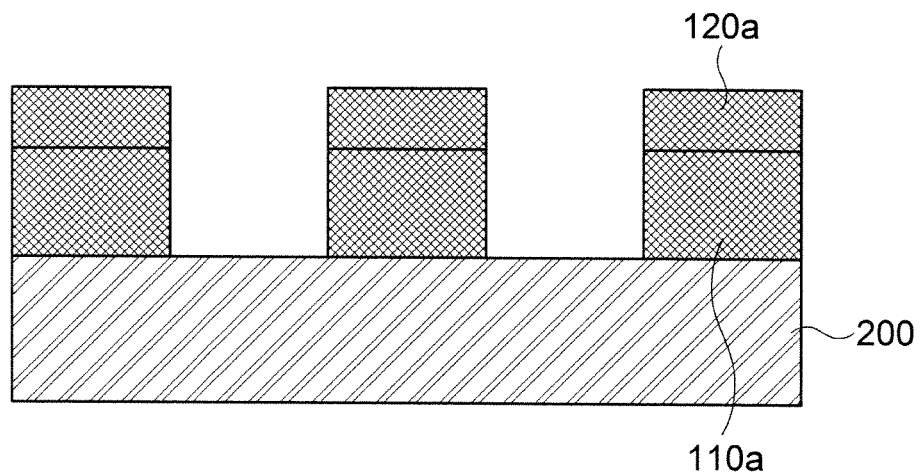

In addition, in the development process, in the case in which the developing solution is sprayed so as to develop up to the pattern forming resist layer 110 of the lower portion, the uncured portion 110b of the pattern forming resist layer 110 and the uncured portion 120b of the liquid contact preventing resist layer 120 may be removed together as shown in FIG. 10.

According to the second exemplary embodiment of the present invention, a direct contact between the pattern forming resist layer 110 and the developing solution may be blocked by the uncured portion 120a of the liquid contact preventing resist layer 120, thereby showing the effect described in the first exemplary embodiment of the present invention as it is. In addition to this, according to the second exemplary embodiment of the present invention, since the resist film 100 having the dry form in which the pattern forming resist layer 110 and the liquid contact preventing resist layer 120 are adhered to each other is used, work efficiency may be increased.

Figure 11:
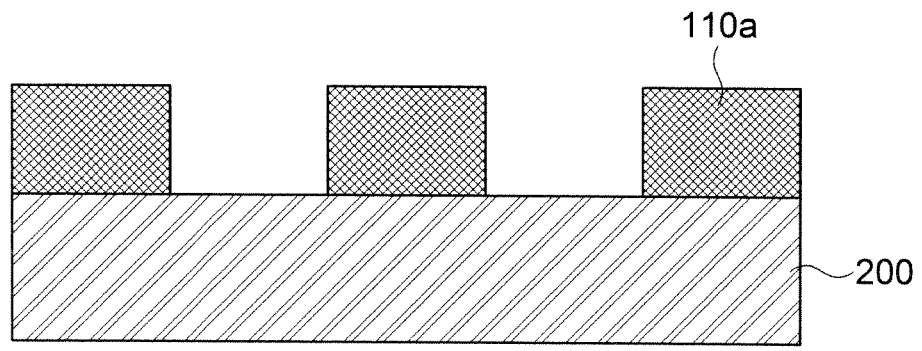

When the development process is finished, as shown in FIG. 11, the pattern may be finally completed by removing the liquid contact preventing resist layer 120, specifically, the cured portion 120a of the liquid contact preventing resist layer 120.

According to an exemplary embodiment of the present invention, in the case in which the resist film according to the present invention is used, the developing solution is not directly sprayed onto the pattern forming resist layer on which the pattern is formed and consequently, there is no physical hit due to the spray pressure, such that the undercut problem according to the relate art may not occur at the lower portion of the pattern which is insufficiently cured.

In addition, the surface cutting phenomenon of the resist is minimized, such that the appearance defect such as the abrasion, the filler protrusion, or the like may be prevented.

In addition, the decrease in the carboxyl group (—COOH) molecules on the resist surface is minimized, such that the decrease in surface energy may be prevented, thereby making it possible to improve flowability of the resin in the underfill process.

The present invention has been described in connection with what is presently considered to be practical exemplary embodiments. Although the exemplary embodiments of the present invention have been described, the present invention may be also used in various other combinations, modifications and environments. In other words, the present invention may be changed or modified within the range of concept of the invention disclosed in the specification, the range equivalent to the disclosure and/or the range of the technology or knowledge in the field to which the present invention pertains. The exemplary embodiments described above have been provided to explain the best state in carrying out the present invention. Therefore, they may be carried out in other states known to the field to which the present invention pertains in using other inventions such as the present invention and also be modified in various forms required in specific application fields and usages of the invention. Therefore, it is to be understood that the invention is not limited to the disclosed embodiments. It is to be understood that other embodiments are also included within the spirit and scope of the appended claims.

What is claimed is:

1. A resist film comprising:
    a first resist layer for forming a pattern, the first resist layer including an upper surface and a lower surface; and
    a second resist layer for preventing a contact by liquid, the second resist layer being adhered to one surface of the upper surface and the lower surface of the first resist layer.

2. The resist film according to claim 1, wherein the second resist layer comprises a material which is exposable and developable.

3. The resist film according to claim 2, wherein the second resist layer is developable by a same developing solution used for developing the first resist layer.

4. The resist film according to claim 1, wherein the first resist layer comprises a polymer resin composition containing a filler.

5. The resist film according to claim 1, wherein a protective film is applied onto at least one of an outer exposed surface of the second resist layer and an outer exposed surface of the first resist layer.

6. The resist film according to claim 1, wherein the first resist layer includes a cured portion and an uncured portion.

7. A method of forming a pattern, the method comprising:
    applying a first resist layer for forming a pattern onto one surface of a substrate;
    selectively exposing the first resist layer;
    laminating a second resist layer for preventing a contact by liquid on the first resist layer; and
    spraying a developing solution on a surface of the second resist layer.

8. The method according to claim 7, wherein the step of spraying of the developing solution develops both the second resist layer and an uncured portion of the first resist layer together.

9. The method according to claim 7, wherein the first resist layer is formed by applying liquid-phase resist ink to the one surface of the substrate.

10. A method of forming a pattern, the method comprising:
    preparing a resist film having a first resist layer for forming a pattern and a second resist layer for preventing a contact by liquid, the first resist layer and the second resist layer being adhered to each other;
    applying the resist film onto one surface of a substrate so that the first resist layer is in contact with the one surface of the substrates;
    selectively exposing and developing the resist film; and
    removing the second resist layer.

11. The method according to claim 10, wherein the selective exposing of the resist film comprises irradiating light so as to expose up to the first resist layer.

12. The method according to claim 10, wherein the developing of the resist film comprises developing both an uncured portion of the second resist layer and an uncured portion of the first resist layer.

* * * * *